United States Patent
Ahn

(10) Patent No.: US 11,393,707 B2
(45) Date of Patent: Jul. 19, 2022

(54) CONTACTLESS VERTICAL TRANSFER DEVICE USING LINEAR MOTOR

(71) Applicant: FOUNDATION OF SOONGSIL UNIVERSITY-INDUSTRY COOPERATION, Seoul (KR)

(72) Inventor: Hyeong Joon Ahn, Seoul (KR)

(73) Assignee: FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 0 days.

(21) Appl. No.: 17/289,477

(22) PCT Filed: Apr. 9, 2019

(86) PCT No.: PCT/KR2019/004188
§ 371 (c)(1),
(2) Date: Apr. 28, 2021

(87) PCT Pub. No.: WO2020/091162
PCT Pub. Date: May 7, 2020

(65) Prior Publication Data
US 2021/0398833 A1    Dec. 23, 2021

(30) Foreign Application Priority Data
Oct. 29, 2018    (KR) ........................ 10-2018-0130040

(51) Int. Cl.
*H01L 21/677* (2006.01)
*H02K 11/215* (2016.01)
(Continued)

(52) U.S. Cl.
CPC ........ *H01L 21/67709* (2013.01); *B65G 54/02* (2013.01); *F16C 32/0472* (2013.01);
(Continued)

(58) Field of Classification Search
CPC ..... B65G 54/02; B65G 23/23; F16C 32/0603; F16C 32/0472; H02K 41/031;
(Continued)

(56) References Cited

U.S. PATENT DOCUMENTS 9,365,354 B2 * 6/2016 Takagi .................. H02P 29/032
9,729,039 B2 * 8/2017 Hon ...................... H02K 41/033
(Continued)

FOREIGN PATENT DOCUMENTS

JP    2011098786    5/2011
JP    2013507893    3/2013
(Continued)

OTHER PUBLICATIONS

International Search Report—PCT/KR2019/004188 dated Jul. 26, 2019.

*Primary Examiner* — James R Bidwell
(74) *Attorney, Agent, or Firm* — Cantor Colburn LLP

(57) ABSTRACT

Provided is a contactless vertical transfer device using a linear motor. The contactless vertical transfer device using a linear motor includes: a transfer unit for picking up an article; and a linear motor located on a side portion of the transfer unit to move the transfer unit, wherein the linear motor comprises at least one driving unit that is located on a side portion of the transfer unit and provided with a mover which a coil is wound; and a rail unit that is located apart from the mover by a predetermined distance in a lateral direction and provided with a plurality of magnet portions disposed in a transfer direction of the transfer unit. The transfer unit is moved along the rail unit by a thrust force of the mover and the magnet portion.

13 Claims, 5 Drawing Sheets

(51) Int. Cl.
  *B65G 54/02* (2006.01)
  *F16C 32/04* (2006.01)
  *F16C 32/06* (2006.01)
  *H01L 21/67* (2006.01)
  *H02K 41/03* (2006.01)
  *H02K 49/04* (2006.01)

(52) U.S. Cl.
  CPC .... *F16C 32/0603* (2013.01); *H01L 21/67259* (2013.01); *H01L 21/67712* (2013.01); *H02K 11/215* (2016.01); *H02K 41/031* (2013.01); *H02K 49/046* (2013.01)

(58) Field of Classification Search
  CPC ............... H02K 49/046; H02K 11/215; H01L 21/67709; H01L 21/67259; H01L 21/67712
  USPC ........................................................ 198/619
  See application file for complete search history.

(56) References Cited

U.S. PATENT DOCUMENTS

| | | | |
|---|---|---|---|
| 10,407,273 B2* | 9/2019 | Ginsberg | B66B 5/06 |
| 10,549,954 B2* | 2/2020 | Ginsberg | B66B 9/02 |
| 10,944,953 B2* | 3/2021 | Babayoff | A61C 19/04 |
| 10,968,055 B2* | 4/2021 | Guernsey | B65G 47/38 |
| 2011/0100252 A1 | 5/2011 | Fukukawa | |
| 2012/0193172 A1 | 8/2012 | Matscheko et al. | |

FOREIGN PATENT DOCUMENTS

| | | |
|---|---|---|
| KR | 100712450 | 5/2007 |
| KR | 20140100297 | 8/2014 |
| KR | 101471760 | 12/2014 |
| KR | 101646499 | 8/2016 |

\* cited by examiner

CONTACTLESS VERTICAL TRANSFER DEVICE USING LINEAR MOTOR

BACKGROUND

1. Technical Field

The present disclosure relates to a contactless vertical transfer device using a linear motor.

2. Related Art

In general, an electronic component is a component for performing electrical driving in an electronic device, and an example thereof may be a semiconductor device such as a DRAM or a SRAM in which a chip is connected to a substrate. The semiconductor device is manufactured on the basis of a wafer made of a thin single crystal substrate which is formed of silicon. Specifically, the semiconductor device is manufactured by performing a fab process of forming a plurality of chips with a circuit pattern which is patterned on a wafer, a bonding process of electrically connecting each of the chips formed in the fab process to each of the substrates, and a molding process of protecting the chip connected to the substrate, from the outside.

In this case, the semiconductor devices are mounted on a mounting mechanism such as a cassette, a magazine, or a tray, and the processes are executed while the semiconductor devices are transferred to facilities corresponding to each of the processes. Specifically, the transfer operation is implemented through an over hand transfer (OHT) device for transferring the mounting mechanism while the over hand transfer device moves along a rail after the rail is installed to provide a path between facilities on a ceiling of a factory in a form of a clean room in which the facilities are installed.

On the other hand, in relation to this, Korean Patent Registration No. 10-1471760 (title of the disclosure: over hand transfer device) discloses contents in which a mounting mechanism capable of mounting a plurality of electronic components while moving along a rail installed on a ceiling inside a factory is transferred between the facilities for manufacturing the electronic components, and which is configured of a body, a driving wheel, and a cleaning wheel.

However, such a conventional over hand transfer device has a problem in that electronic components may be contaminated by fine dust generated as the driving wheel comes into contact with the rail to be transferred.

SUMMARY

The present application is provided to solve the problems of the related art described above, and an object of the present application is to provide a contactless vertical transfer device which uses a linear motor of which a traction force and a repulsive force of a repulsion bearing are used to float the vertical transfer device in a contactless manner, and traveling stability may be improved by adjusting a ratio of the traction force and the thrust force by vector control of the linear motor.

However, the technical problem to be solved by the present example is not limited to the technical problems as described above, and other technical problems may exist.

As technical means to solve the technical problems described above, according to an example of the present application, there is provided a contactless vertical transfer device using a linear motor, including: a transfer unit for picking up an article; and a linear motor located on a side portion of the transfer unit to move the transfer unit, wherein the linear motor comprises at least one driving unit that is located on a side portion of the transfer unit and provided with a mover which a coil is wound; and a rail unit that is located apart from the mover by a predetermined distance in a lateral direction and provided with a plurality of magnet portions disposed in a transfer direction of the transfer unit. The transfer unit is moved along the rail unit by a thrust force of the mover and the magnet portion.

According to the above-described problem solving means of the present application, by using the traction force of the linear motor and the repulsive force of the repulsion bearing, the transfer unit may be floated in a contactless manner, and the ratio of the traction force and the thrust force is adjusted by vector control of the linear motor, thereby improving traveling stability.

DETAILED DESCRIPTION OF THE EMBODIMENTS

Figure 1:
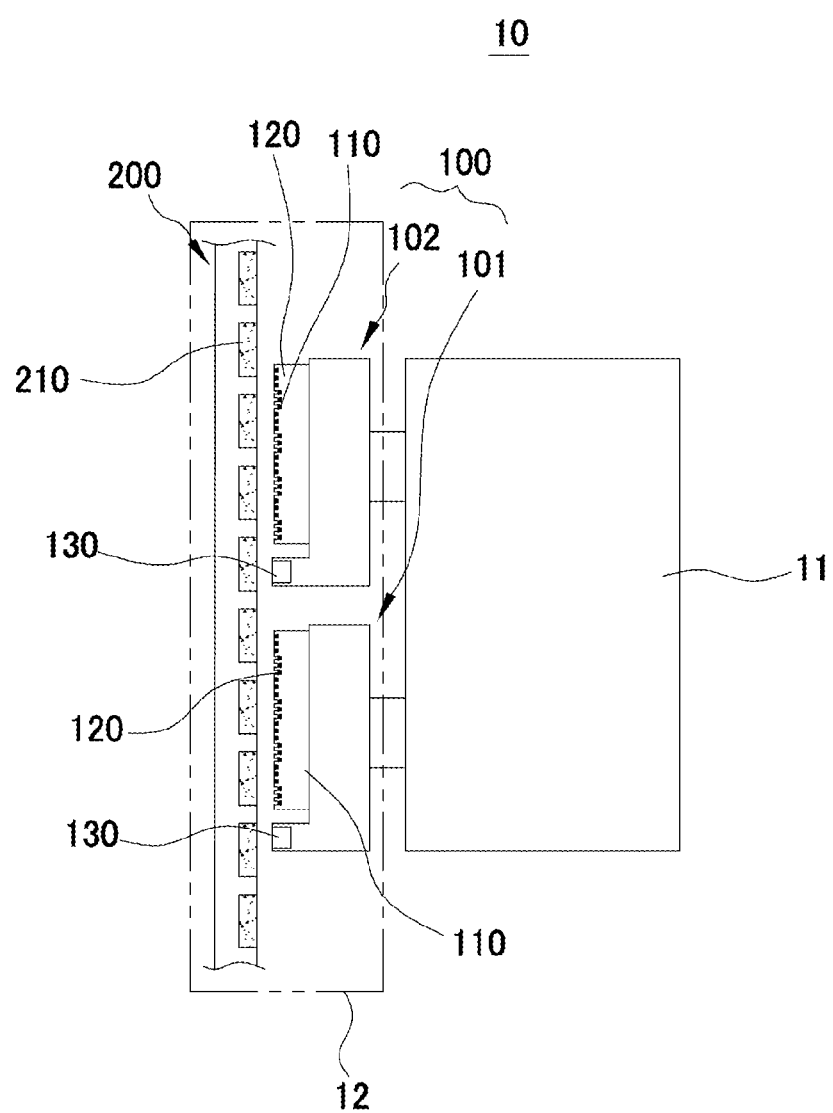
FIG. 1 a sectional view of a contactless vertical transfer device using a linear motor according to an example of the present disclosure.

Hereinafter, examples of the present application will be described in detail with reference to the accompanying drawings so that those of ordinary skill in the art may easily implement the present application. However, the present application may be implemented in various different forms and is not limited to the examples described herein. In addition, in the drawings, portions irrelevant to the description are omitted in order to clearly describe the present application, and similar reference numerals are attached to similar portions throughout the present specification.

Throughout the present specification, when a portion is said to be "connected" with another portion, this includes not only a case where it is "directly connected", but also a case where it is "electrically connected" with another element interposed therebetween.

Throughout the present specification, when a member is located "on" another member, this includes not only a case where a member is in contact with the other member, but also a case where another member exists between the two members.

In the entire specification of the present application, when a certain portion "includes" a certain component, it means that other components may be further included rather than excluding other components unless otherwise stated. The terms "about", "substantially", or the like to the extent used throughout the present specification are used at or close to the numerical value when manufacturing and material tolerances specific to the stated meaning are presented. To assist the understanding of the present application, accurate or absolute figures are used to prevent unreasonable use of the stated disclosure by unscrupulous infringers. As used throughout the present specification of the present application, the term "step (to)" or "step of" does not mean "step for".

The present application relates to a contactless vertical transfer device using a linear motor. For example, the contactless vertical transfer device using the linear motor according to an example of the present disclosure may be a device that moves a transfer unit in a vertical direction, that is, in the direction of gravity.

Figure 2:
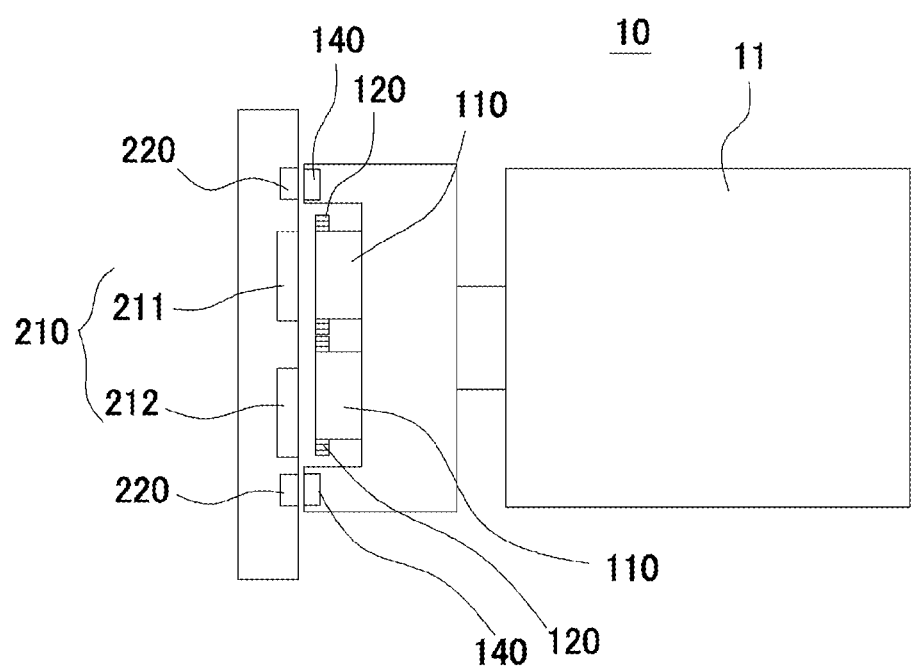
FIG. 2 is a sectional view of the contactless vertical transfer device using the linear motor according to an example of the present disclosure, which is viewed from another side.
Figure 3:
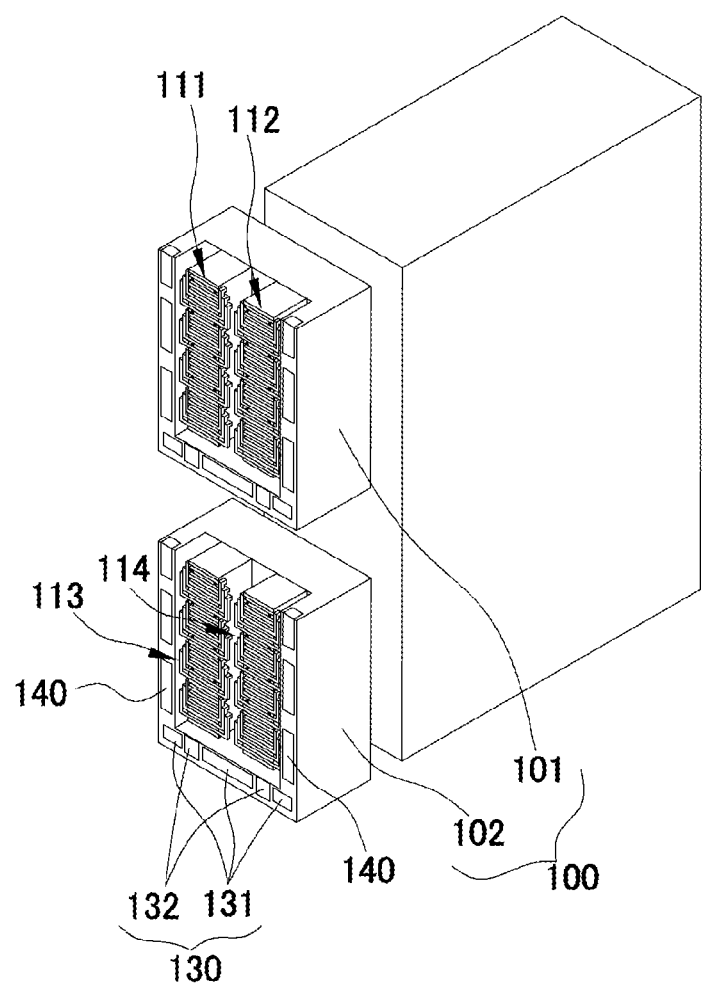
FIG. 3 is a perspective view of a driving unit and a transfer unit according to an example of the present disclosure.
Figure 4:
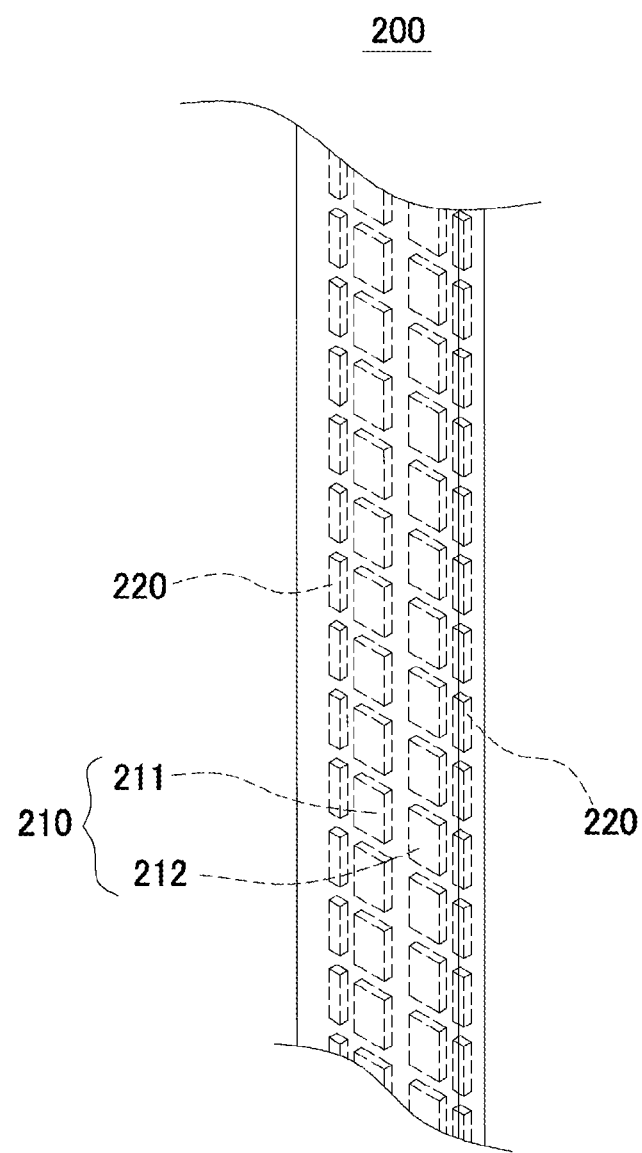
FIG. 4 is a perspective view of the rail unit according to an example of the present disclosure.
Figure 5:
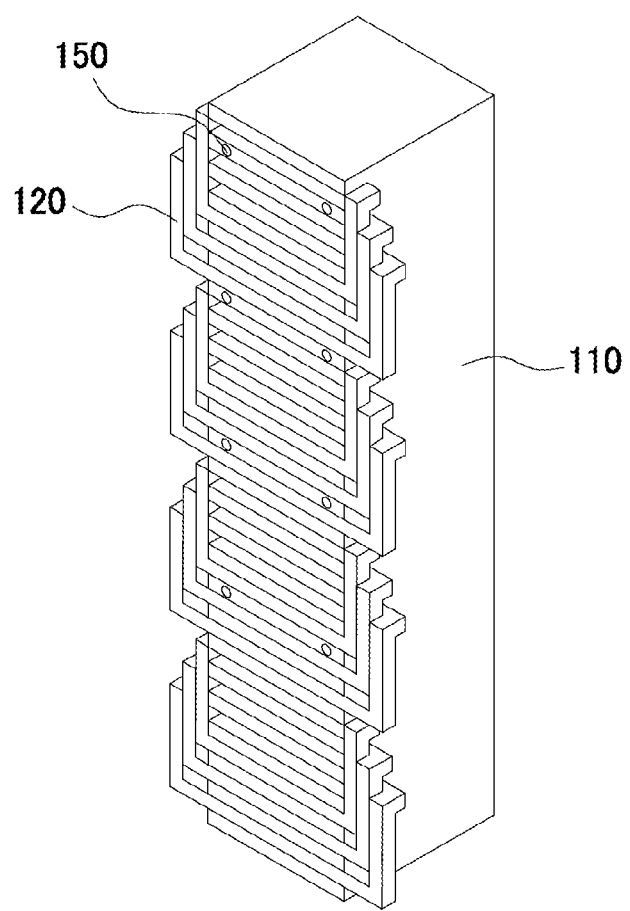
FIG. 5 is a view for explaining a mover according to an example of the present disclosure.

FIG. 1 is a sectional view of the contactless vertical transfer device using the linear motor according to an example of the present disclosure, FIG. 2 is a sectional view of the contactless vertical transfer device using the linear motor according to an example of the present disclosure, which is viewed from another side, FIG. 3 is a perspective view of a driving unit and a transfer unit according to an example of the present disclosure, FIG. 4 is a perspective view of the rail unit according to an example of the present disclosure, and FIG. 5 is a view for explaining a mover according to an example of the present disclosure.

First, a contactless vertical transfer device 10 (hereinafter referred to as 'contactless vertical transfer device 10') using the linear motor according to an example of the present application will be described.

The contactless vertical transfer device 10 includes a transfer unit 11 for picking up an article and a linear motor 12 located on a side portion of the transfer unit 11 to move the transfer unit 11. The above-described side portion may be in a 9 o'clock direction in FIG. 1 or a direction perpendicular to gravity. For example, the contactless vertical transfer device 10 may be a device that automatically transfers a wafer carrier (front opening unified pod: FOUP) containing a semiconductor wafer. In other words, the transfer unit 11 may include, but is not limited to, a grip portion for loading or unloading the wafer carrier and a storage portion capable of receiving a wafer.

The linear motor 12 is located on the side portion of the transfer unit 11 and may move the transfer unit 11 by using a magnetic force. In other words, the linear motor 12 may float the transfer unit 11 by using a traction force generated through a mover 110 and a magnet portion 210 to be described later. The transfer unit 11 may be moved by using a thrust force generated in the mover 110 and the magnet portion 210. The above-described floating may mean a state where the mover 110 and the magnet portion 210 are located apart from each other by a predetermined distance in a direction perpendicular to the gravity so that the moving unit 11 is in a floating state in the air. For example, the linear motor 12 may be a three-phase linear motor 12 capable of adjusting a magnitude ratio of the thrust force and the traction force by using vector control.

To this end, the linear motor 12 includes at least one driving unit 100 that is located at the side portion of the transfer unit 11, and provided with the mover 110 on which a coil 120 is wound, and a rail unit 200 that is located apart from the mover 110 and includes plurality of magnet portions 210 provided in a transfer direction of the transfer unit 11. Accordingly, the transfer unit 11 may be floated by the traction force of the mover 110 and the magnet portion 210 in a state where the driving unit 100 and the rail unit 200 are located apart from each other by a predetermined distance. In other words, the transfer unit 11 may be used in a manner in which the transfer unit 11 is floated by using an attractive force generated by the interaction between the mover 110 and the magnet portion 210.

In addition, the transfer unit 11 may be moved along the rail unit 200 by the thrust force of the mover 110 and the magnet portion 210. In other words, the coil 120 of the mover 110 is connected to form moving magnetic fields that moves linearly in parallel, and an eddy current swirling on a surface of the magnet portion 210 is induced. Therefore, an electromagnetic linear thrust force is generated based on the Fleming's left-hand rule between the moving magnetic field of the mover 110 and the eddy current of the magnet portion 210. At this time, the generated linear thrust force acts to relatively move the mover 110 and the magnet portion 210, and the transfer unit 11 moves linearly due to this action. In this way, the inductive magnetic field generated by the mover 110 imparts the thrust force to the transfer unit 11 via the magnet portion 210. For example, the mover 110 may be in a form in which the coil 120 is wound around an iron core, and the magnet portion 210 may be a permanent magnet, but are not limited thereto.

Further, the driving unit 100 may include a first driving unit 101 and a second driving unit 102 located apart from each other at a predetermined distance in a direction in which the transfer unit 11 moves. However, the present disclosure is not limited thereto, and the contactless vertical transfer device 10 of the present disclosure may have one driving unit 100 or three or more driving units 100.

The first driving unit 101 may include a first mover 111 and a second mover 112 located apart from each other by a predetermined distance in a direction perpendicular to the moving direction of the transfer unit 11. In addition, the second driving unit 102 may include a third mover 113 and a fourth mover 114 located apart from each other by a predetermined distance in the direction perpendicular to the moving direction of the transfer unit 11.

In addition, the magnet portion 210 may include a plurality of first magnets 211 located at positions corresponding to the positions of the first mover 111 and the third mover 113 in a longitudinal direction of the rail unit 200, and a plurality of second magnets 212 located at positions corresponding to the positions of the second mover 112 and the fourth mover 114 in the longitudinal direction of the rail unit 200. The longitudinal direction of the rail unit 200 may be the direction of gravity, that is, an upper direction from a ground surface.

Accordingly, the contactless vertical transfer device 10 may move the transfer unit 11 not only linearly but also curvedly by using the four movers 110. Specifically, in a case where the thrust forces of the first mover 111 and the third mover 113 are formed stronger than those of the second mover 112 and the fourth mover 114, the transfer part 11 may rotate in the direction in which the first mover 111 is located, and on the contrary, in a case where the thrust forces of the second mover 112 and the fourth mover 114 are formed stronger than those of the first mover 111 and the third mover 113, the transfer unit 11 may rotate in the direction in which the second mover 112 is located. In addition, a centrifugal force generated when the transfer unit 11 rotates may be compensated by adjusting angles of the rail unit 200 and the driving unit 100.

In addition, the first magnet 211 and the second magnet 212 may be disposed such that polarities of a surface facing the mover 110 alternate in the transfer direction of the transfer unit 11. For example, the magnet portions 210, as illustrated in FIG. 1, may be disposed at predetermined intervals with polarities opposite each other being alternately disposed, but are not limited thereto. The magnet portions 210 may be disposed in close contact with each other with the polarities opposite each other being alternately disposed. In addition, the first magnet 211 may be disposed to have polarities opposite those of the adjacent second magnets 212.

In addition, the driving unit 100 may include eddy current braking units 130 located above or below the driving unit 100. For example, the eddy current braking unit 130 may include a coil and a switch.

The eddy current braking unit 130 may include traveling safety coils 131 located at a position corresponding to between the first magnet 211 and the second magnet 212, and at positions corresponding to outer sides of the first magnet 211 and the second magnet 212, respectively, and emergency stop coils 132 located at positions corresponding to centers of the first magnet 211 and the second magnet 212. In other words, the contactless vertical transfer device 10 may selectively switch the three traveling safety coils 131 and the emergency stop coils 132 located between the traveling safety coils 131 to control turning stability and the braking force. That is, the traveling safety coil 131 serves to stably travel along the rail unit 200 in a straight or curved line when the transfer unit 11 moves, and the emergency stop coil 132 serves to provide the braking power to stop the transfer unit 11 in an emergency.

In addition, the contactless vertical transfer device 10 may further include repulsion bearings 140 and 220 for generating a repulsive force between the rail unit 200 and the driving unit 100.

The repulsion bearings 140 and 220 may include a first repulsion bearing 140 located on one side surface of a protrusion portion formed by protruding both sides of one side surface of the driving unit 100 in a direction perpendicular to the moving direction of the transfer unit 11, and a second repulsion bearing 220 located on the rail unit 200 so as to correspond to the bearing 140. The one side surface of the driving unit 100 may mean one of surfaces located in a direction perpendicular to the direction of gravity, and the both sides may mean a side portion located in a direction perpendicular to the direction of gravity.

In addition, the polarities of the surfaces of the first and second repulsion bearings 140 and 220 facing each other are opposite to each other. In other words, the first repulsion bearing 140 and the second repulsion bearing 220 are configured of permanent magnets, and are disposed to have the surfaces facing each other having opposite polarities, thereby generating the repulsive force between the rail unit 200 and the driving unit 100.

Specifically, the traction force generated by the mover 110 and the magnet portion 210 acts about 3 to 5 times the thrust force, and a self-weight of the transfer unit 11 is supplied by using this. It is possible to stably implement the contactless floating by achieving equilibrium between the traction force and the repulsive force of the first repulsion bearing 140 and the second repulsion bearing 220. In addition, in order to maintain a constant gap between the mover 110 and the magnet portion 210, the traction force of the mover 110 and the magnet portion 210, and the repulsive force of the repulsion bearings 140 and 220 must be different from each other, and a constant gap in static equilibrium is maintained by increasing the number of the repulsion bearings 140 and 220.

In addition, the repulsion bearings 140 and 220 may be air bearings which are located in the rail unit 200 or the driving unit 100, and use air pressure. In other words, when the air bearing is located in the rail unit 200, air is discharged in a direction in which the driving unit 100 is located, thereby generating the repulsive force between the rail unit 200 and the driving unit 100. When the air bearing is located in the driving unit 100, air may be discharged in a direction in which the rail unit 200 is located, thereby generating the repulsive force between the rail unit 200 and the driving unit 100.

The contactless vertical transfer device 10 may further include a plurality of Hall sensors 150 that are disposed in a grid shape on the upper surface of the mover 110 and measure a magnetic field distribution of the magnet portion 210a to measure the relative position between the magnet portion 210 and the mover 110 from the magnetic field distribution of the magnet portion 210. In addition, it is preferable that a sine wave of ¼ pitch interval is output at a position spaced apart from the magnet portion 210 by 8 mm or more, so that the Hall sensor 150 and the magnet portion 210 are separated by 8 mm or more.

The Hall sensor 150 may be manufactured as a very thin semiconductor plate by attaching a semiconductor piece to a ceramic or plastic substrate or coating the semiconductor piece on the substrate with a predetermined thickness.

The Hall sensors 150 are disposed at regular intervals from each other as described above, and may measure sine and cos magnetic fields of the magnet portion 210 to measure the relative position with the magnet portion 210. In other words, the plurality of Hall sensors 150 may be located in each mover 110 at regular intervals from each other in the transfer direction of the transfer unit 11 and a direction perpendicular to the transfer direction. For example, four Hall sensors 150 are disposed in the transfer direction of the transfer unit 11, and four Hall sensors 150 are disposed to be apart from each other at predetermined distances in the direction perpendicular to the transfer direction of the transfer unit 11, so that a total of eight Hall sensors 150 may be located in each mover 110. In addition, the plurality of Hall sensors 150 may be disposed apart from each other by ¼ pitch of the sine and cos magnetic fields, but the present disclosure is not limited thereto.

Accordingly, the Hall sensor 150 derives a sensor value from an average of sensor values of the four Hall sensors 150 disposed in the transfer direction of the transfer unit 11, and thereby there is an effect that an error of the displacement of the transfer unit 11 may be significantly reduced.

In addition, the Hall sensor 150 measures the magnetic field of the magnet portion 210, measures the displacement of the transfer part 11 using the phase, and measures the magnitude of the sine wave magnetic field generated in the magnet portion 210 to measure a gap between the magnet portion 210 and the mover 110.

In addition, the contactless vertical transfer device 10 may measure the displacement in the direction perpendicular to the transfer direction of the transfer unit 11, that is, in the direction perpendicular to the moving direction of the mover 110 through the Hall sensors 150 that are apart from each other at predetermined distances in the left and right direction of the mover. The above-described left and right directions may be the 10 o'clock and 4 o'clock directions in FIG. 3. For example, in a case where the transfer unit 11 is deviated from a preset position by a predetermined distance or more based on information transmitted from the Hall sensors 150, the contactless vertical transfer device 10 may apply a current to the emergency stop coil 132 to stop the transfer unit 11.

The foregoing description of the present application is for illustrative purposes only, and those of ordinary skill in the art to which the present application pertains will be able to understand that other specific forms may be easily modified without changing the technical spirit or essential features of the present application. Therefore, it should be understood that the examples described above are illustrative and non-limiting in all respects. For example, each component described as a single type may be implemented in a distributed manner, and similarly, components described as being distributed may also be implemented in a combined form.

The scope of the present application is indicated by the claims to be described later rather than the detailed description, and all changes or modified forms derived from the meaning and scope of the claims and their equivalent concepts should be interpreted as being included in the scope of the present application.

| <Description of symbols> | |
|---|---|
| 10: | contactless vertical transfer device |
| 11: | transfer unit |
| 12: | linear motor |
| 100: | driving unit |
| 101: | first driving unit |
| 102: | second driving unit |
| 110: | mover |
| 111: | first mover |
| 112: | second mover |
| 113: | third mover |
| 114: | fourth mover |
| 120: | coil |
| 130: | eddy current braking unit |
| 131: | traveling safety coils |
| 132: | emergency stop coils |
| 140: | first repulsion bearing |
| 150: | hall sensor |
| 200: | rail unit |
| 210: | magnet portion |
| 211: | first magnet |
| 212: | second magnet |
| 220: | second repulsion bearing |

What is claimed is:

1. A contactless vertical transfer device using a linear motor, comprising:
 a transfer unit for picking up an article; and
 a linear motor located on a side portion of the transfer unit to move the transfer unit,
 wherein the linear motor comprises:
 at least one driving unit that is located on a side portion of the transfer unit and provided with a mover in which a coil is wound; and
 a rail unit that is located apart from the mover by a predetermined distance in a lateral direction and provided with a plurality of magnet portions disposed in a transfer direction of the transfer unit,
 wherein the transfer unit is moved along the rail unit by a thrust force of the mover and the magnet portion,
 wherein the at least one driving unit includes a first driving unit and a second driving unit located apart from each other by a predetermined distance in a moving direction of the transfer unit, and
 wherein the mover includes a first mover, a second mover, a third mover and a fourth mover,
 the first driving unit includes the first mover and the second mover located apart from each other by a predetermined distance in a direction perpendicular to the moving direction of the transfer unit,
 the second driving unit includes the third mover and the fourth mover located apart from each other by a predetermined distance in the direction perpendicular to the moving direction of the transfer unit, and
 the magnet portion includes a plurality of first magnets located at positions corresponding to positions of the first mover and the third mover in a length direction of the rail unit; and a plurality of second magnets located at positions corresponding to positions of the second mover and the fourth mover in the length direction of the rail unit.

2. The contactless vertical transfer device of claim 1, wherein the first magnet and the second magnet are disposed such that polarities of a surface facing the mover are alternately located in the transfer direction of the transfer unit, and
 the first magnet is disposed so as to have polarities opposite to those of an adjacent second magnet.

3. The contactless vertical transfer device of claim 1, wherein the at least one driving unit further includes eddy current braking units located above or below the at least one driving unit.

4. The contactless vertical transfer device of claim 3, wherein the eddy current braking unit includes traveling safety coils respectively located at a position corresponding to between the first magnet and the second magnet, and at positions corresponding to outer sides of the first magnet and the second magnet; and emergency stop coils respectively located at positions corresponding to centers of the first magnet and the second magnet.

5. The contactless vertical transfer device of claim 1, further comprising:
 a repulsion bearing for generating a repulsive force between the rail unit and the at least one driving unit.

6. The contactless vertical transfer device of claim 5, wherein the repulsion bearing includes a first repulsion bearing located on one side surface of a protruding portion in which both sides of one side surface of the at least one driving unit protrude in a direction perpendicular to the moving direction of the transfer unit; and a second repulsion bearing located in the rail unit to correspond to the first repulsion bearing.

7. The contactless vertical transfer device of claim 5, wherein the repulsion bearing is an air bearing located in the rail unit or the at least one driving unit.

8. The contactless vertical transfer device of claim 1, further comprising: a plurality of Hall sensors that are disposed in a grid shape on an upper surface of the mover, and measure a sine wave magnetic field distribution of the magnet portion to measure a relative position between the magnet portion and the mover from a magnetic field of the magnet portion.

9. The contactless vertical transfer device of claim 8, wherein the plurality of Hall sensors are disposed at regular intervals from each other and measure sine and cos magnetic fields of the magnet portion to measure a relative position with the magnet portion.

10. A contactless vertical transfer device using a linear motor, comprising:
 a transfer unit for picking up an article; and
 a linear motor located on a side portion of the transfer unit to move the transfer unit, wherein the linear motor comprises: at least one driving unit that is located on a side portion of the transfer unit and provided with a mover in which a coil is wound; and a rail unit that is located apart from the mover by a predetermined distance in a lateral direction and provided with a plurality of magnet portions disposed in a transfer direction of the transfer unit, and wherein the transfer unit is moved along the rail unit by a thrust force of the mover and the magnet portion; and
 a repulsion bearing for generating a repulsive force between the rail unit and the at least one driving unit, wherein the repulsion bearing includes a first repulsion bearing located on one side surface of a protruding portion in which both sides of one side surface of the at least one driving unit protrude in a direction perpendicular to the moving direction of the transfer unit; and
a second repulsion bearing located in the rail unit to correspond to the first repulsion bearing.

11. The contactless vertical transfer device of claim 10, wherein the repulsion bearing is an air bearing located in the rail unit or the at least one driving unit.

12. A contactless vertical transfer device using a linear motor, comprising:
a transfer unit for picking up an article; and
a linear motor located on a side portion of the transfer unit to move the transfer unit, wherein the linear motor comprises: at least one driving unit that is located on a side portion of the transfer unit and provided with a mover in which a coil is wound; and a rail unit that is located apart from the mover by a predetermined distance in a lateral direction and provided with a plurality of magnet portions disposed in a transfer direction of the transfer unit, and wherein the transfer unit is moved along the rail unit by a thrust force of the mover and the magnet portion; and
a plurality of Hall sensors that are disposed in a grid shape on an upper surface of the mover, and measure a sine wave magnetic field distribution of the magnet portion to measure a relative position between the magnet portion and the mover from a magnetic field of the magnet portion.

13. The contactless vertical transfer device of claim 12, wherein the plurality of Hall sensors are disposed at regular intervals from each other and measure sine and cos magnetic fields of the magnet portion to measure a relative position with the magnet portion.

* * * * *